US011320752B2

(12) United States Patent
Bang

(10) Patent No.: US 11,320,752 B2
(45) Date of Patent: May 3, 2022

(54) SUPPORTING UNIT AND SUBSTRATE PROCESSING APPARATUS INCLUDING THE SAME

(71) Applicant: SEMES CO., LTD., Cheonan-si (KR)

(72) Inventor: Jaeoh Bang, Seoul (KR)

(73) Assignee: Semes Co., Ltd., Chungcheongnam-do (KR)

( * ) Notice: Subject to any disclaimer, the term of this patent is extended or adjusted under 35 U.S.C. 154(b) by 0 days.

(21) Appl. No.: 16/913,039

(22) Filed: Jun. 26, 2020

(65) Prior Publication Data
US 2020/0409275 A1 Dec. 31, 2020

(30) Foreign Application Priority Data

Jun. 27, 2019 (KR) .......................... 10-2019-0076897

(51) Int. Cl.
*G03F 7/20* (2006.01)
*H01L 21/687* (2006.01)
*H01L 21/67* (2006.01)

(52) U.S. Cl.
CPC .... *G03F 7/70858* (2013.01); *H01L 21/67109* (2013.01); *H01L 21/68742* (2013.01)

(58) Field of Classification Search
CPC ........... G03F 7/70858; H01L 21/67109; H01L 21/67178; H01L 21/67346; H01L 21/67748; H01L 21/6838; H01L 21/68742; H01L 21/6875; H01L 21/6719; H01L 21/68707
See application file for complete search history.

(56) References Cited

U.S. PATENT DOCUMENTS

| 2012/0088203 A1* | 4/2012 | Mizunaga | H01L 21/68707 432/253 |
| 2021/0129175 A1* | 5/2021 | Bang | B05C 13/00 |

FOREIGN PATENT DOCUMENTS

| JP | 2008-210965 A | | 9/2008 |
| JP | 2010-123750 A | | 6/2010 |
| JP | 2012-099787 A | | 5/2012 |
| JP | 2016-119337 A | | 6/2016 |
| KR | 200429783 Y1 | | 10/2006 |
| KR | 20-2014-0001829 A | | 1/2014 |
| KR | 20210097536 A | * | 9/2021 |

OTHER PUBLICATIONS

Machine translation of JP 2016-119337-A, Jun. 30, 2016.*
Korean Office Action dated Jul. 30, 2020 issued in corresponding Korean Appln. No. 10-2019-0076897.
Korean Notice of Allowance dated Mar. 4, 2021 issued in corresponding Korean Appln. No. 10-2019-0076897.

* cited by examiner

*Primary Examiner* — Peter B Kim
(74) *Attorney, Agent, or Firm* — Harness, Dickey & Pierce, P.L.C.

(57) ABSTRACT

A supporting unit is provided to support a substrate. The supporting unit includes a supporting plate including a pressure reducing fluid passage formed inside the supporting plate, and a flanger provided in a groove formed in a top surface of the supporting plate. A lower area of the flanger is connected to the pressure reducing fluid passage in the groove, and the flanger moves up and down by reduced pressure applied through the pressure reducing fluid passage.

18 Claims, 12 Drawing Sheets

TYPICAL

SUPPORTING UNIT AND SUBSTRATE PROCESSING APPARATUS INCLUDING THE SAME

CROSS-REFERENCE TO RELATED APPLICATIONS

A claim for priority under 35 U.S.C. § 119 is made to Korean Patent Application No. 10-2019-0076897 filed on Jun. 27, 2019, in the Korean Intellectual Property Office, the entire contents of which are hereby incorporated by reference.

BACKGROUND

Embodiments of the inventive concept relate to supporting units and substrate processing apparatuses.

In general, to fabricate a semiconductor device, various processes, such as cleaning, depositing, photolithography, etching, and ion implanting processes. The photolithography process, which is performed to form a pattern, is important to realize a high integrated semiconductor device.

The photolithography process is performed to form a pattern on a substrate. In the photolithography process, a coating process, an exposing process, and a developing process are sequentially performed, and each process includes a plurality of substrate processing steps. The substrate processing steps are subject to a procedure of temporarily storing a substrate such that a next step is performed after one processing step is performed. In the procedure of temporarily storing the substrate, since a substrate, which has been completely processed, is usually maintained in a higher-temperature state. Accordingly, a process to cool the substrate is performed such that the substrate is cooled. Accordingly, a typical substrate processing apparatus to perform the photolithography process with respect to the substrate includes a cooling plate to cool the substrate during the procedure of temporarily storing the substrate.

FIG. 1 is a perspective view illustrating a typical cooling plate. Referring to FIG. 1, a cooling plate 5000 generally has a fluid passage 5100 formed therein to allow a cooling fluid to flow. In addition, when a substrate is seated on the cooling plate 5000, a supporting protrusion 5200 is provided to prevent the substrate from directly making contact with the cooling plate 5000. However, when considering heat transfer between the cooling plate 5000 and the substrate, there is a limitation in increasing the height of the supporting protrusion 5200. Accordingly, a top surface of the cooling plate 5000 is provided to be close to the substrate placed above the cooling plate 5000. When the substrate is cooled by the cooling plate 5000, the pressure difference is made between an upper area and a lower area of the substrate. Accordingly, when the substrate is lifted from the cooling plate 5000 through a lift pin, a phenomenon in which the substrate receives force applied downward, so called, a squeeze effect. Accordingly, when the substrate is lifted from the cooling plate 5000, the substrate is bounced and thus broken. Accordingly, there is required an apparatus to reduce the distance between the substrate and the cooling plate 5000 while removing the squeeze effect.

SUMMARY

Embodiments of the inventive concept provide a supporting unit and a substrate processing apparatus including the same, capable of effectively processing a substrate.

Embodiments of the inventive concept provide a supporting unit capable of reducing a distance between a substrate and a supporting plate when performing heat treatment for the substrate, and a substrate processing apparatus including the same.

Embodiments of the inventive concept provide a supporting unit capable of minimizing a squeeze effect caused when performing the heat treatment for a substrate, and a substrate processing apparatus including the same.

Embodiments of the inventive concept provide a substrate processing method and a substrate processing apparatus, capable of minimizing deviation of a substrate from a hand or vibration of the substrate by appropriately seating the substrate into a hand of a carrying unit.

The objects which will be achieved in the inventive concept are not limited to the above, but other objects, which are not mentioned, will be apparently understood to those skilled in the art.

According to an exemplary embodiment, an apparatus for processing a substrate is provided. The apparatus for processing the substrate may include a housing having a space inside the housing, and a supporting unit to support the substrate, in the space. The supporting unit may include a supporting plate having a pressure reducing fluid passage formed inside the supporting plate, a temperature adjusting member to adjust a temperature of the supporting plate, and a flanger provided in a groove formed in a top surface of the supporting plate. A lower area of the flanger may be connected to the pressure reducing fluid passage, in the groove, and the flanger may move up and down by reduced pressure applied through the pressure reducing fluid passage.

According to an embodiment, the flanger may have a through hole passing through an upper portion and a lower portion of the flanger, and the through hole may communicate with the pressure reducing fluid passage.

According to an embodiment, the flanger may include a first body, and a second body extending upward from the first body and having a diameter less than a diameter of the first body.

According to an embodiment, the groove may have a locking step which is stepped in a lateral direction of the groove, and a locking member may be provided between a top surface of the first body and the locking step.

According to an embodiment, the apparatus may further include an elastic member provided on a bottom surface of the first body.

According to an embodiment, the first body may include an insertion end portion recessed upward from a bottom surface of the first body, the insertion end portion may communicate with the through hole, and the elastic member may be inserted into the insertion end portion.

According to an embodiment, an upper end of the second body may have a rounded shape.

According to an embodiment, the apparatus may further include a controller to control the supporting unit, and the controller may control the supporting unit to reduce a distance between the supporting plate and the substrate by moving the flanger down as the reduced pressure is applied through the pressure reducing fluid passage, when adjusting a temperature of the substrate supported to the supporting unit.

According to an embodiment, a pin may be provided on the supporting plate, and a distance between a top surface of the supporting plate and an upper end of the pine may be provided as a first distance.

According to an embodiment, in the flanger, the distance between the top surface of the supporting plate and the upper end of the pine may be provided as a second distance, when the reduced pressure is not applied through the pressure reducing fluid passage, the second distance may be greater than the first distance, and third distance may be less than or equal to the first distance.

According to an embodiment, the pressure reducing fluid passage may include a main fluid passage, a first fluid passage branching from the main fluid passage, a second fluid passage branching from the main fluid passage at a point, which is different from a point from which the first fluid passage branches. The first fluid passage may be connected to the groove, and the second fluid passage may extend to the top surface of the supporting plate.

According to an embodiment, the supporting plate may include a heat transfer fluid passage through which a fluid supplied by the temperature adjusting member flows.

According to an exemplary embodiment, a supporting unit to support a substrate is provided. The supporting unit may include a supporting plate including a pressure reducing fluid passage formed inside the supporting plate, and a flanger provided in a groove formed in a top surface of the supporting plate, a lower area of the flanger may be connected to the pressure reducing fluid passage in the groove, and the flanger may move up and down by reduced pressure applied through the pressure reducing fluid passage.

According to an embodiment, the flanger may have a through hole passing through an upper portion and a lower portion of the flanger, and the through hole may communicate with the pressure reducing fluid passage.

According to an embodiment, the flanger may include a first body, and a second body extending upward from a top surface of the first body and having a diameter less than a diameter of the first body.

According to an embodiment, the groove may have a locking step which is stepped in a lateral direction of the groove, and a locking member may be interposed between a top surface of the first body and the locking step According to an embodiment, the apparatus may further include an elastic member provided on a bottom surface of the first body.

According to an embodiment, the first body may include an insertion end portion recessed upward from a bottom surface of the first body, the insertion end portion may communication with the through hole, and an elastic member may be inserted into the insertion end portion.

According to an embodiment, the elastic member may be a spring.

According to an embodiment, an upper end of the second body may have a rounded shape.

According to an embodiment, the pressure reducing fluid passage may include a main fluid passage, a first fluid passage branching from the main fluid passage, a second fluid passage branching from the main fluid passage at a point, which is different from a point from which the first fluid passage branches. The first fluid passage may be connected to the groove, and the second fluid passage may extend to the top surface of the supporting plate.

According to an embodiment, the flanger may include a material including synthetic resin or ceramic.

According to an embodiment, a temperature adjusting member may be further provided to adjust the temperature of the supporting plate.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
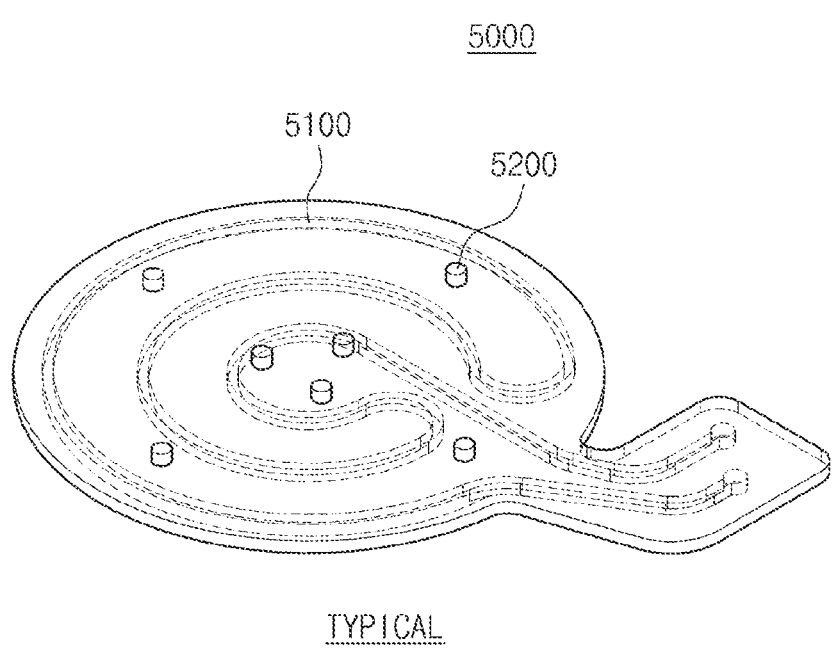
FIG. 1 is a perspective view illustrating a typical cooling plate.

Hereinafter, the embodiment of the inventive concept will be described in detail with reference to accompanying drawings to allow those skilled in the art to easily reproduce the inventive concept. However, the inventive concept may be implemented in various forms, and is limited to embodiments described herein. In addition, in the following description of the inventive concept, a detailed description of well-known art or functions will be ruled out in order not to unnecessarily obscure the gist of the inventive concept. In addition, parts performing similar functions and similar operations will be assigned with the same reference numerals throughout the drawings.

When a certain part "includes" a certain component, the certain part does not exclude other components, but may further include other components if there is a specific opposite description. In detail, It will be further understood that the terms "comprises," "comprising," "includes," or "including," or "having" specify the presence of stated features, numbers, steps, operations, components, parts, or the combination thereof, but do not preclude the presence or addition of one or more other features, numbers, steps, operations, components, components, and/or the combination thereof.

The singular forms are intended to include the plural forms unless the context clearly indicates otherwise. In addition, the shapes and the sizes of elements in accompanying drawings will be exaggerated for more apparent description.

Figure 2:
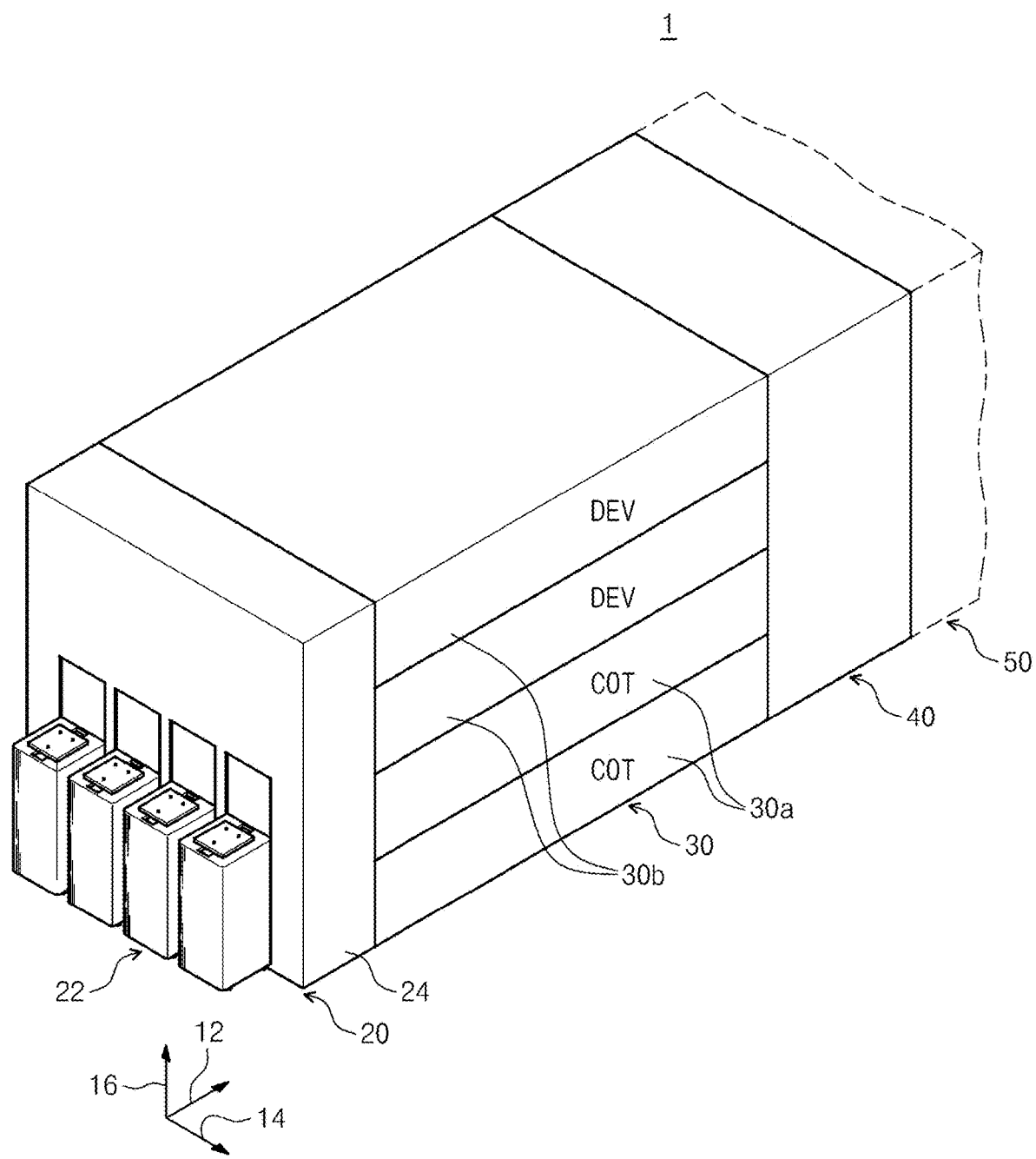
FIG. 2 is a perspective view schematically illustrating a substrate processing apparatus of the inventive concept.
Figure 3:
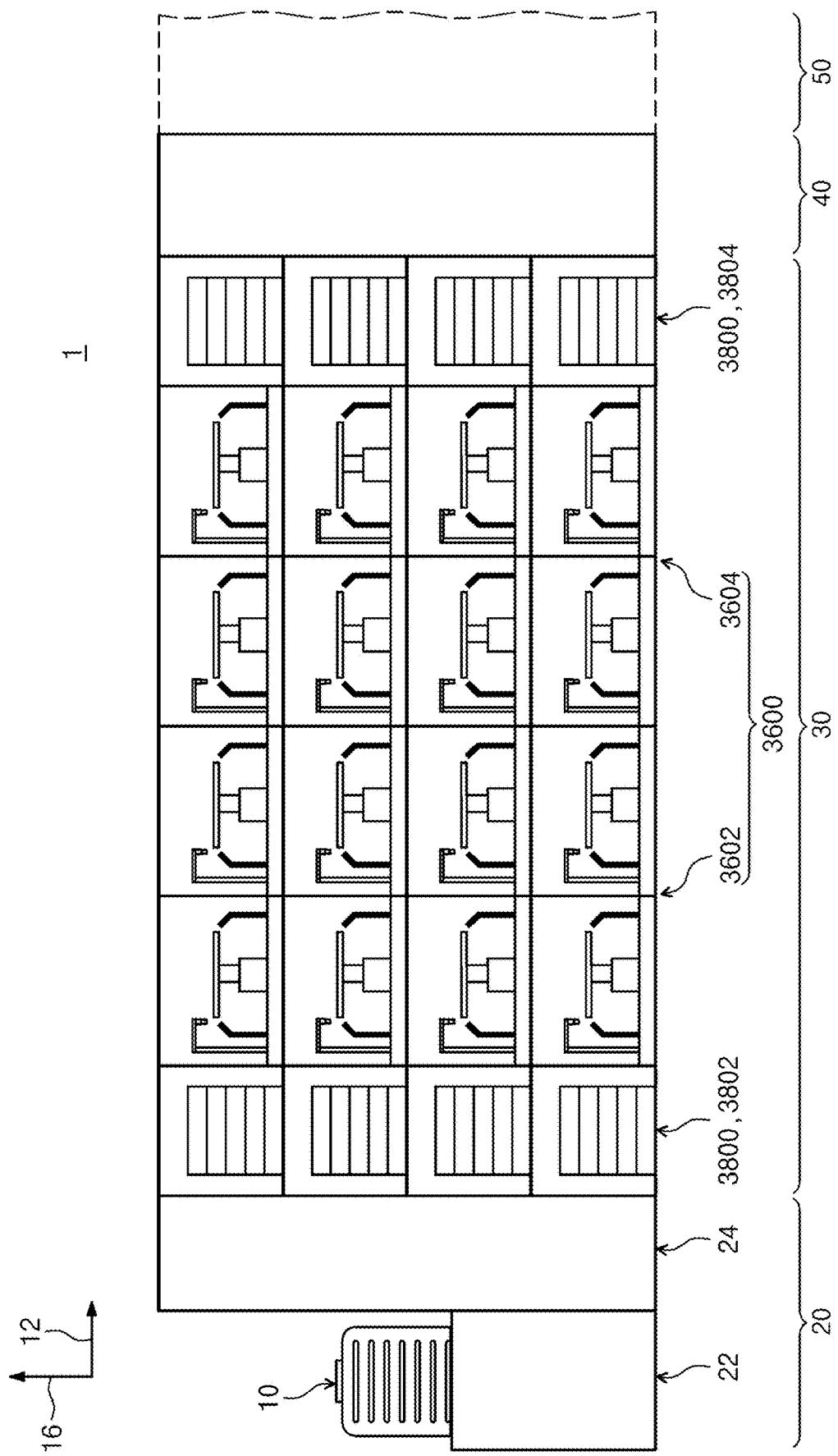
FIG. 3 is a sectional view of a substrate processing apparatus, which illustrates a coating block or a developing block of FIG. 2.
Figure 4:
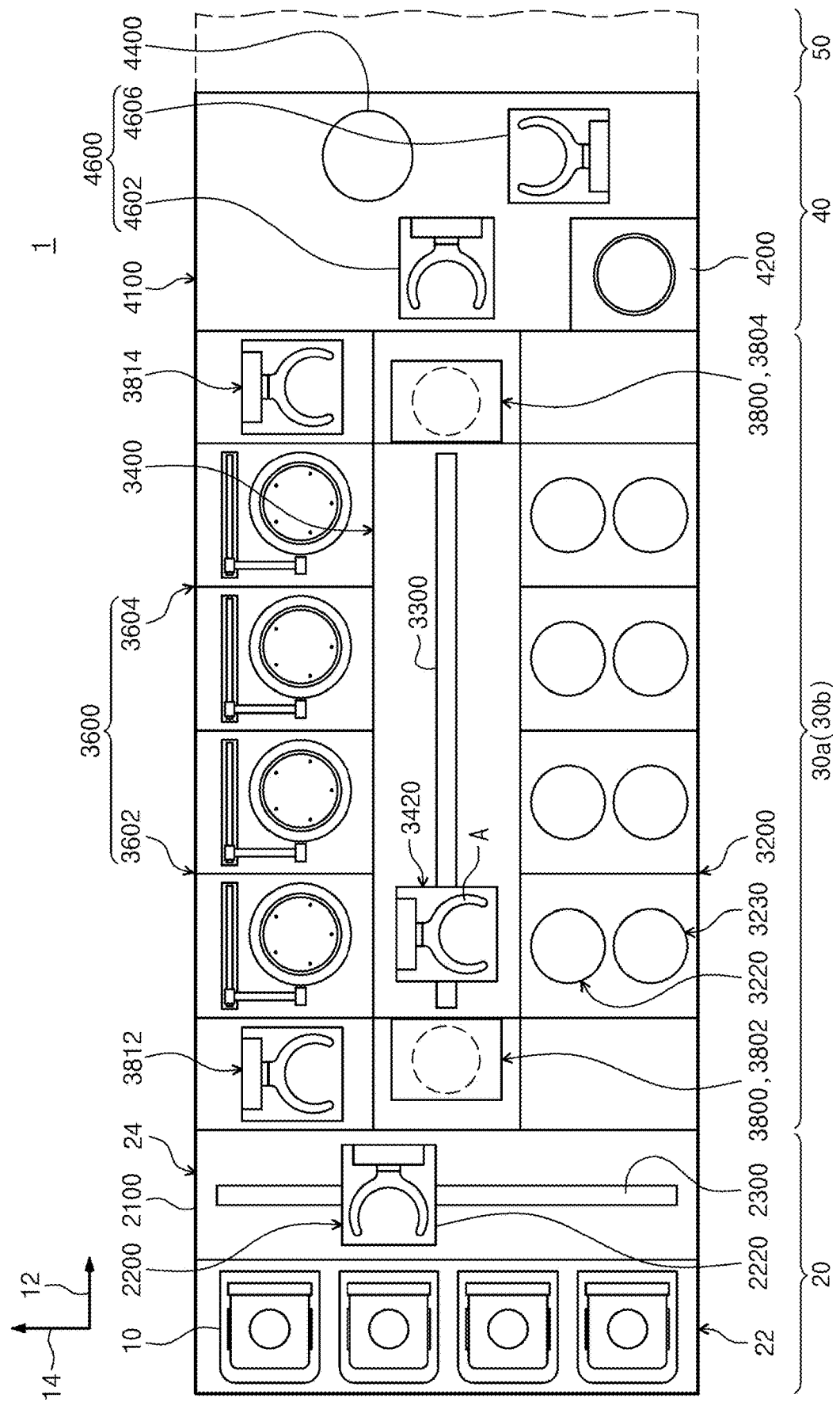
FIG. 4 is a plan view of a substrate processing apparatus of FIG. 2.

FIG. 2 is a perspective view schematically illustrating a substrate processing apparatus of the inventive concept, FIG. 3 is a sectional view of a substrate processing apparatus, which illustrates a coating block or a developing block of FIG. 2, FIG. 4 is a plan view of a substrate processing apparatus of FIG. 2.

Referring to FIGS. 2 to 4, an apparatus (substrate processing apparatus) 1 for processing a substrate includes an index module 20, a treating module 30, and an interface module 40. According to an embodiment, the index module 20, the treating module 30, and the interface module 40 are sequentially aligned in line with each other. Hereinafter, a direction in which the index module 20, the treating module 30, and the interface module 40 are arranged will be referred to as an X-axis direction 12, a direction that is perpendicular to the first direction 12 when viewed from above will be referred to as a Y-axis direction 14, and a direction perpendicular to both the X-axis 12 and the Y-axis direction 14 will be referred to as a Z-axis direction 16.

The index module 20 carries a substrate 'W' to the treating module 30 from a container 10 to receive the substrate 'W', and a substrate 'W' completely treated is received into the container 10. The length direction of the index module 20 is provided in the Y-axis direction 14. The index module 20 has a load port 22 and an index frame 24. The load port 22 is positioned at an opposite side of the treating module 30, based on the index frame 24. The container 10 having substrates 'W' is placed in the load port 22. A plurality of load ports 22 may be provided and may be arranged in the Y-axis direction 14.

The container 10 may include a container 10 for sealing such as a front open unified pod (FOUP). The container 10 may be placed on the load port 22 by a transfer unit (not illustrated) such as Overhead Transfer, Overhead Conveyor, or Automatic GuidedVehicle.

An index robot 2200 is provided inside the index frame 24. A guide rail 2300, which has a longitudinal direction provided in the Y-axis direction 14, is provided in the index frame 24, and the index robot 2200 may be provided to be movable on the guide rail 2300. The index robot 2200 may include a hand 2220 in which the substrate 'W' is positioned, and the hand 2220 may be provided to be movable forward and backward, rotatable about the third direction 16, and movable in the Z-axis direction 16.

The treating module 30 performs coating and developing processes with respect to the substrate 'W'. The treating module 30 has a coating block 30a and a developing block 30b. The coating block 30a forms a coating process with respect to the substrate 'W', and the developing block 30b performs a developing process with respect to the substrate 'W'. A plurality of coating blocks 30a are provided and stacked on each other. A plurality of developing blocks 30b are provided, and stacked on each other. According to an embodiment of FIG. 3, two coating blocks 30a are provided and two developing blocks 30b are provided. The coating blocks 30a may be disposed under the developing blocks 30b. According to an example, two coating blocks 30a may be subject to the same process and may be provided in the same structure. In addition, two developing blocks 30a may be subject to the same process and may be provided in the same structure.

Referring to FIG. 4, the coating block 30a has a heat treating chamber 3200, a carrying chamber 3400, a liquid treating chamber 3600, and a buffer chamber 3800. The heat treating chamber 3200 performs a heat treatment process on the substrate 'W'. The heat treatment process may include a cooling process and a heating process. The liquid treating chamber 3600 supplies a liquid onto the substrate 'W' to form a liquid film. The liquid film may be a photoresist film or an anti-reflective film. The carrying chamber 3400 carries the substrate 'W' between the heat treating chamber 3200 and the liquid treating chamber 3600 inside the coating block 30a.

The carrying chamber 3400 has a longitudinal direction parallel to the first direction 12. A carrying unit 3420 is provided in the carrying chamber 3400. The carrying unit 3420 carries the substrate 'W' among the heat treating chamber 3200, the liquid treating chamber 3600, and the buffer chamber 3800. According to an example, the carrying unit 3420 may include a hand 'A' in which the substrate 'W' is positioned, and the hand 'A' may be provided to be movable forward and backward, rotatable about the Z-axis direction 16, and movable in the Z-axis direction 16. A guide rail 3300, which has a longitudinal direction parallel to the X-axis direction 12, is provided in the carrying chamber 3400, and the carrying unit 3420 may be provided to be movable on the guide rail 3300.

Figure 5:
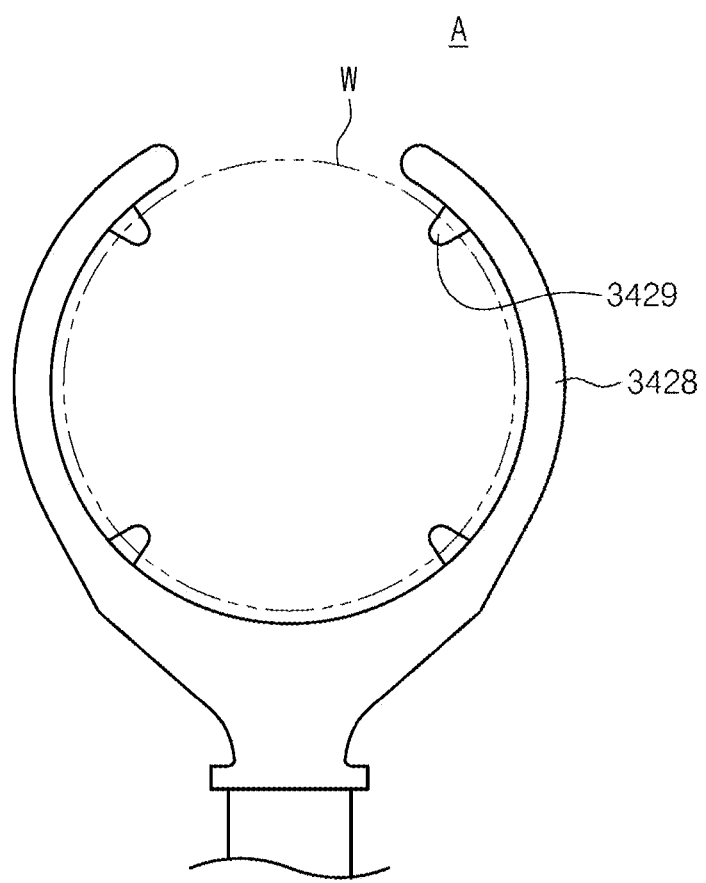
FIG. 5 is a view illustrating a hand of a carrying unit of FIG. 4.

FIG. 5 is a view illustrating a hand of a carrying unit of FIG. 4. Referring to FIG. 4, the hand 'A' has a base 3428 and a supporting protrusion 3429. The base 3428 may have an annular ring shape in which a part of the circumference is bent. The base 3428 has an inner diameter greater than the diameter of the substrate 'W'. The supporting protrusion 3429 extends inward from base 3428. A plurality of supporting protrusions 3429 are provided to support an edge area of the substrate 'W'. According to an example, four supporting protrusions 3429 may be provided at equal distances.

Referring back to FIGS. 3 and 4, a plurality of heat treating chambers 3200 are provided. The heat treating chambers 3200 are arranged side by side in the X-axis direction 12. The heat treating chambers 3200 are positioned at one side of the carrying chamber 3400.

Figure 6:
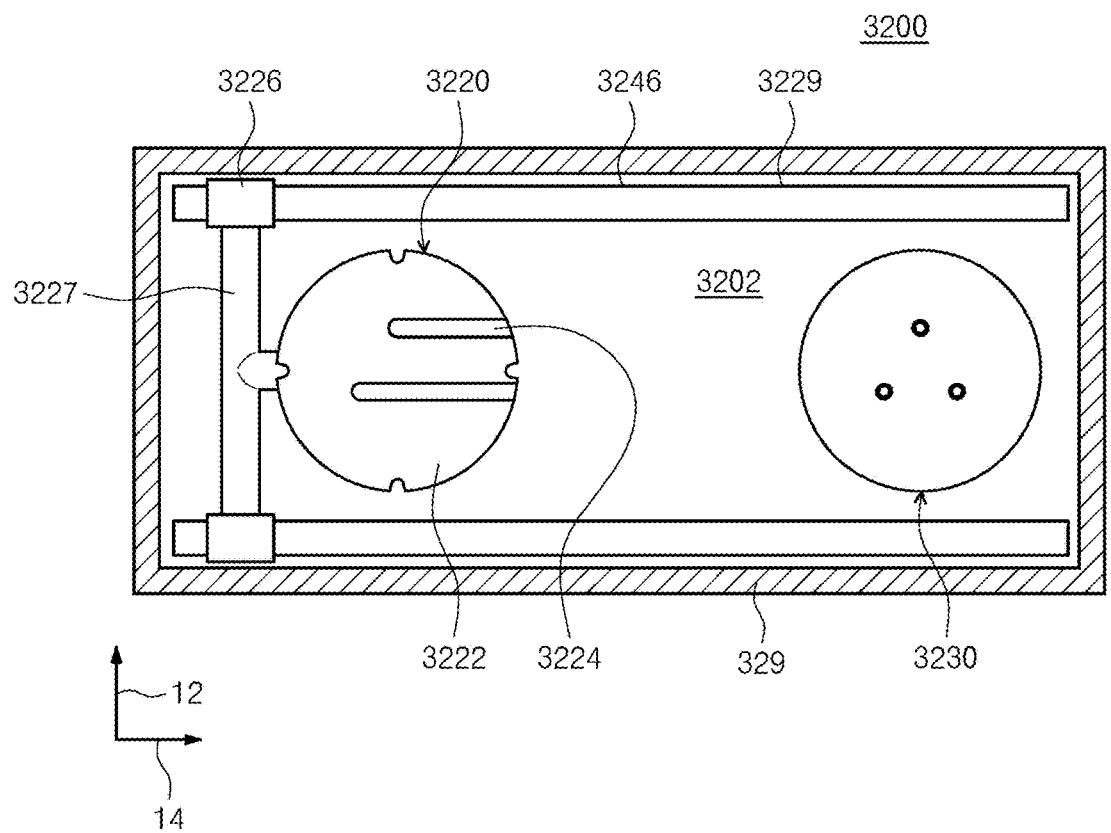
FIG. 6 is a plan sectional view schematically illustrating the heat treating chamber of FIG. 4.
Figure 7:
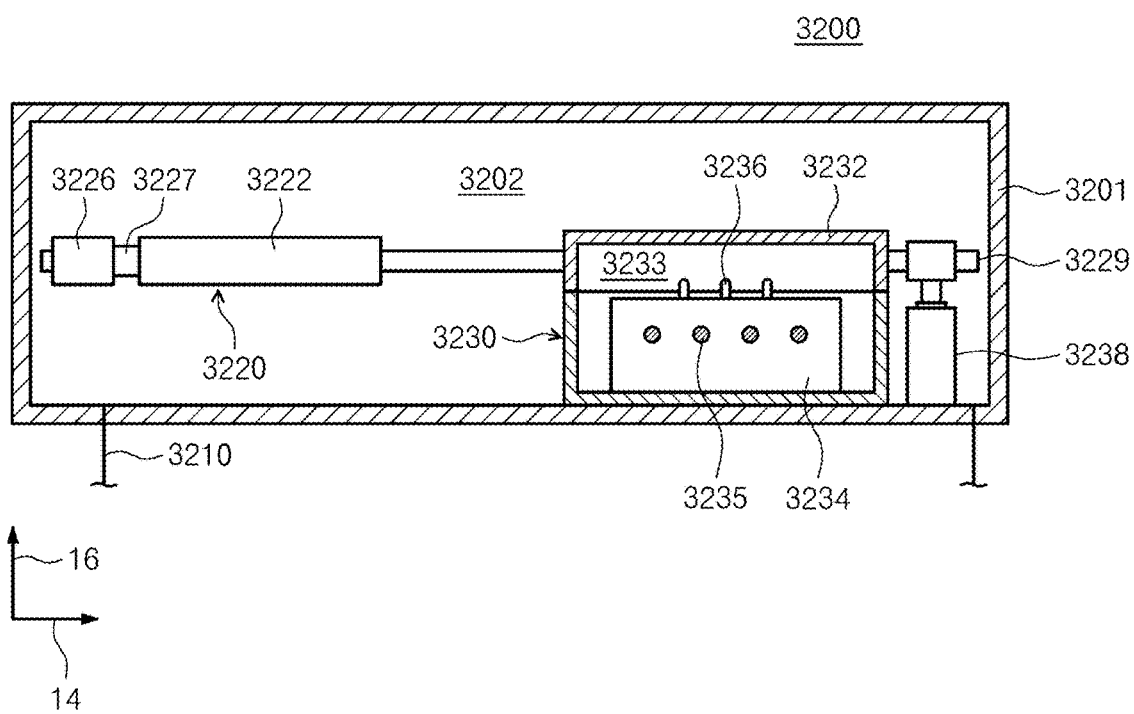
FIG. 7 is a front sectional view illustrating the heat treating chamber of FIG. 6.

FIG. 6 is a plan sectional view schematically illustrating the heat treating chamber of FIG. 4, and FIG. 7 is a front sectional view illustrating the heat treating chamber of FIG. 6. The heat treating chamber 3200 includes a treating container 3201, a cooling unit 3220, and a heating unit 3230.

The treating container 3201 has an inner space 3202. The treating container 3201 has a substantially rectangular parallelepiped shape. The treating container 3201 is formed in a sidewall thereof with an entrance (not illustrated) to introduce or withdraw the substrate 'W'. In addition, a door (not illustrated) may be provided to selectively open or close the entrance. The entrance may be selectively maintained in an open state. The entrance may be formed in an area adjacent to the cooling unit 3220. The cooling unit 3220 and the heating unit 3230 are provided in the inner space 3202 of the treating container 3201. The cooling unit 3220 and the heating unit 3230 are provided side by side in the Y-axis direction 14. An exhaust line 3210 may be connected to the treating container 3201. The exhaust line 3210 may exhaust gas, which is supplied by a fan unit, out of the treating container 3201. The exhaust line 3210 may be connected to a lower portion of the treating container 3201. However, the inventive concept is not limited thereto, but the exhaust line 3210 may be connected to a side portion of the treating container 3201.

The cooling unit 3220 has a cooling plate 3222. The substrate 'W' may be seated on the cooling plate 3222. The cooling plate 3222 may have a substantially circular shape when viewed from above. A cooling member (not illustrated) is provided in the cooling plate 3222. According to an embodiment, the cooling member may be formed in an inner part of the cooling plate 3222 to serve as a fluid passage to which a cooling fluid flows. Accordingly, the cooling plate 3222 may cool the substrate 'W'. The cooling plate 3222 may have a diameter corresponding to that of the substrate 'W'. A notch may be formed in an edge of the cooling plate 3222. The notch may have a shape corresponding to the supporting protrusion 3429 formed in the hand 'A' described above. In addition, notches may be provided in number corresponding to the number of supporting protrusions 3429 formed in the hand 'A' and may be formed at positions corresponding to the supporting protrusions 3429. When the vertical positions of the hand 'A' and the cooling plate 3222 are changed, the substrate 'W' is transferred between the hand 'A' and the cooling plate 3222. A plurality of guide grooves 3224 are provided in a slit shape in the cooling plate 3222. The guide groove 3224 extends from an end portion of the cooling plate 3222 to an inner part of the cooling plate 3222. The longitudinal direction of the guide groove 3224 is provided in the Y-axis direction 14, and the guide grooves 3224 are positioned to be spaced apart from each other in the X-axis direction 12. When the substrate 'W' is transferred between the cooling plate 3222 and the heating unit 3230, the guide grooves 3224 prevents the cooling plate 3222 from interfering with a lift pin 3236.

The cooling plate 3222 may be supported by a supporting member 3227. The supporting member 3237 may include a first supporting member in a rod shape and a second supporting member coupled to an intermediate portion of the first supporting member. One end and an opposite end of the first supporting member are coupled to a driver 3226. The driver 3226 is mounted on a guide rail 3229. The guide rail 3229 may have a longitudinal direction provided in the Y-axis direction 14 and may be provided at opposite sides of the treating container 3201 when viewed from above. The cooling plate 3222 may move in the Y-axis direction 14 by the driver 3226 mounted on the guide rail 3229.

The heating unit 3230 may include a housing 3232, a heating plate 3234, a heater 3235, a lift pin 3236, and a driving member 3238. The housing 3232 may include a body and a cover. The body may be disposed under the cover. The body may have the shape of an open upper portion. The body may have the shape of a cylinder having an open upper portion. The cover may cover the upper portion of the body. The cover may have the shape of a cylinder having an open lower portion. Alternatively, the cover may have the shape of a plate to cover an upper portion of the body. The body and the cover are combined with each other to form a treatment space 3233. In addition, the cover may be coupled to a driving member 3238 to move the cover in the vertical direction. Accordingly, the cover may move up and down to open or close the treatment space 3233. For example, when the substrate 'W' is introduced into or withdrawn out of the treatment space 3233, the cover is lifted to open the treatment space 3233. In addition, when the substrate 'W' is treated in the treatment space 3233, the cover moves down to close the treatment space 3233.

A heating plate 3234 may support the substrate 'W' in the treatment space 3233. The substrate 'W' may be seated on the heating plate 3234. The heating plate 3234 may have a substantially circular shape when viewed from above. The heating plate 3234 may has a diameter larger than that of the substrate 'W'. The heater 3235 is placed in the heating plate 3234. The heater 3235 may be provided in the form of a heating resistor to which a current is applied. Accordingly, the heating plate 3234 may heat the substrate 'W'. Lift pints 3236 are provided on the heating plate 3234 to be driven in the vertical direction along the Z-axis direction 16. The lift pin 3236 receives the substrate 'W' from the conveying unit outside the heating unit 3230 to place the substrate 'W' on the heating plate 3234 or lifts the substrate 'W' from the heating plate 3234 to transmit the substrate 'W' to the carrying unit outside the heating unit 3230. According to an embodiment, three lift pins 3236 may be provided.

Referring back to FIGS. 3 and 4, a plurality of buffer chambers 3800 are provided. Some of buffer chambers 3800 are interposed between the index module 20 and the carrying chamber 3400. Hereinafter, the buffer chamber is referred to as a front buffer. A plurality of front buffers 3802 are provided and stacked on each other in the vertical direction. Others of the buffer chambers 3802 and 3804 are interposed between the carrying chamber 3400 and the interface module 40. The buffer chambers are referred to as a rear buffer 3804. A plurality of front buffers 3804 are provided and stacked on each other in the vertical direction. The front buffers 3802 and the rear buffers 3804 temporarily store a plurality of substrates 'W'. The substrate 'W' stored in the front buffer 3802 is introduced and withdrawn by the index robot 2200 and the carrying robot 3420. The substrate 'W' stored in the rear buffer 3804 is introduced and withdrawn by the carrying unit 3420 and the first robot 4602.

Figure 8:
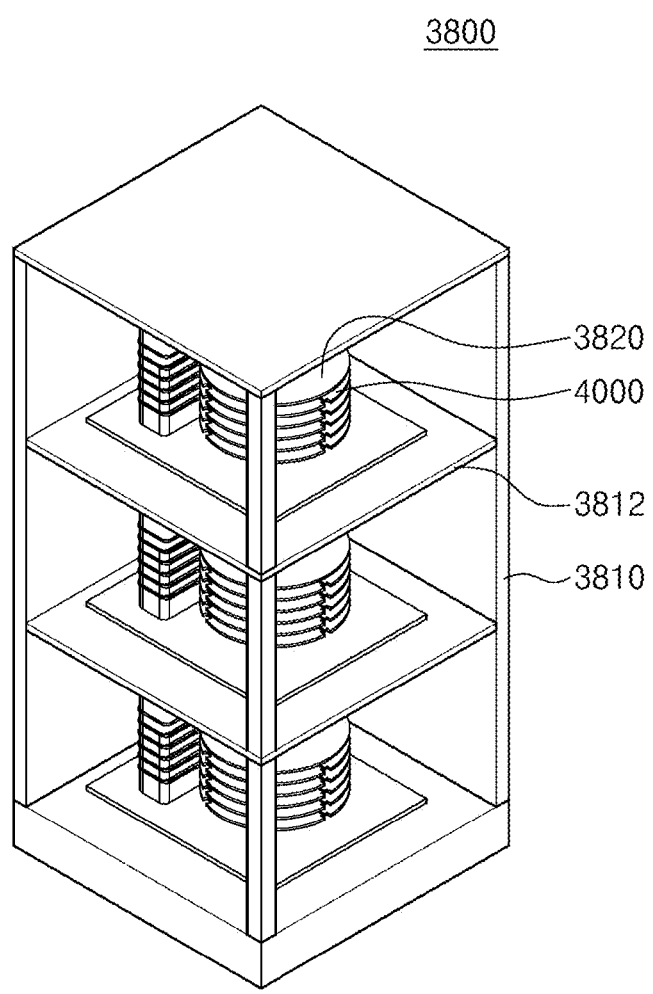
FIG. 8 is a cross-sectional view schematically illustrating a heat processing chamber of FIG. 4.

FIG. 8 is a perspective view schematically illustrating a buffer chamber of FIG. 4. Referring to FIG. 8, the buffer chamber 3800 may include a housing 3810, a buffer plate 3820, and a supporting unit 4000.

The housing 3810 has a space therein. The inner space of the housing 3810 may serve as a space to temporarily store a substrate. The housing 3810 has a substantially rectangular parallelepiped shape. The housing 3810 has opposite side portions that are open. For example, the open opposite side portions of the housing 3810 are positioned in opposition to each other, and one of the open opposite side portions is provided toward the index module 20. The open opposite side portions of the housing 3810 serve as entrances to introduce or withdraw the substrate 'W'.

A base 3812 is provided inside the housing 3810. The base 3812 may be provided in the form of a rectangular plate. A plurality of bases 3812 may be provided. The bases 3812 are spaced apart from each other in the vertical direction. Accordingly, the inner space of the base 3812 is divided in the vertical direction. For example, three bases 3812 are provided. Alternatively, two or less or four or more of bases 3812 may be provided.

Figure 9:
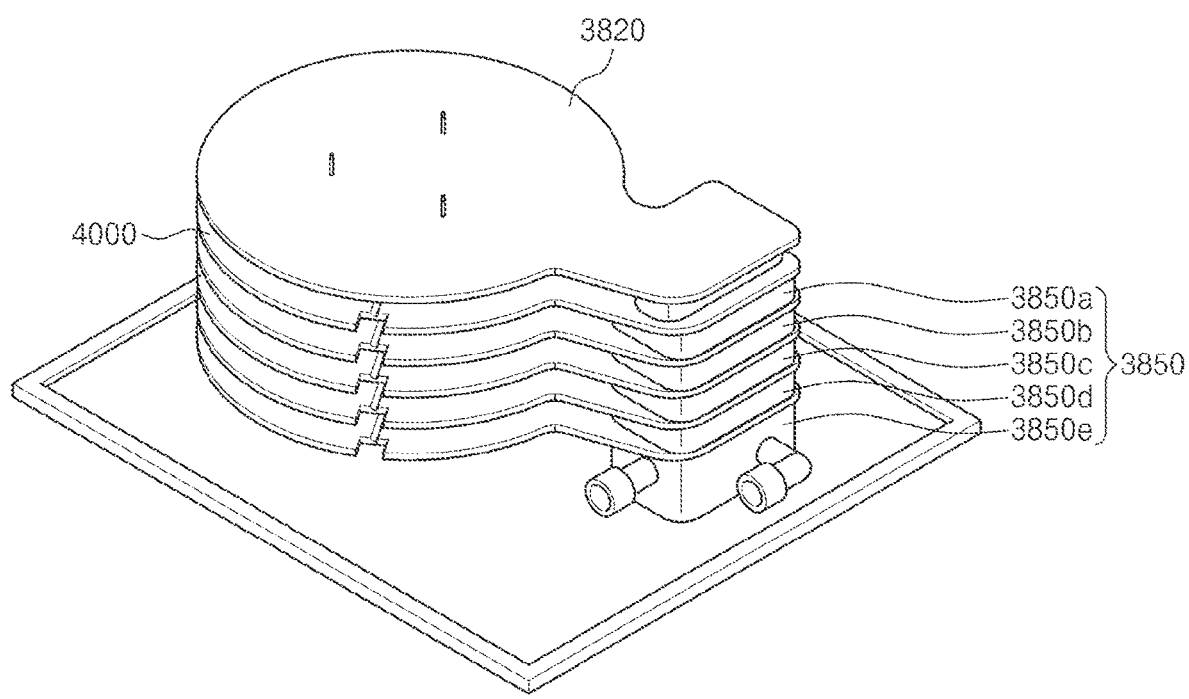
FIG. 9 is a perspective view illustrating a supporting unit, a buffer plate, and a supporting shaft of FIG. 8.

FIG. 9 is a perspective view illustrating a supporting unit, a buffer plate, and a supporting shaft of FIG. 8. Referring to FIG. 9, the buffer plate 3820 and the supporting unit 4000 are positioned in the divided inner space of the housing 3810. The buffer plate 3820 and the supporting unit 4000 are positioned while being spaced apart from each other in a vertical direction. The buffer plate 3820 and the supporting unit 4000 are sequentially arranged downward. According to an example, the plurality of supporting units 4000 are provided, and the buffer plate 3820 and the supporting unit 4000 may be sequentially arranged. Alternatively, a plurality of buffer plates 3820 may be provided. The buffer plate 3820 and the supporting unit 4000 may have a circular plate shape.

A plurality of supporting units 4000 are interposed between the base 3812 and the buffer plate 3820. The plurality of supporting units 4000 are positioned while being spaced apart from each other in the vertical direction. The plurality of supporting units 4000 are stacked on each other while being adjacent to each other. The substrate 'W' may be seated on the supporting unit 4000.

The supporting shaft 3850 supports the buffer plate 3820 and the supporting unit 4000. The supporting shaft 3850 may include a plurality of supporting blocks 3850*a*, 3850*b*, 3850*c*, 3850*d*, and 3850*e*. The supporting blocks 3850*a*, 3850*b*, 3850*c*, 3850*d*, and 3850*e* are arranged while being stacked on each other. The supporting blocks 3850*a*, 3850*b*, 3850*c*, 3850*d*, and 3850*e* are provided in a rectangular parallelepiped shape. The supporting blocks 3850*a*, 3850*b*, 3850*c*, 3850*d*, and 3850*e* support supporting units 4000, respectively.

Figure 10:
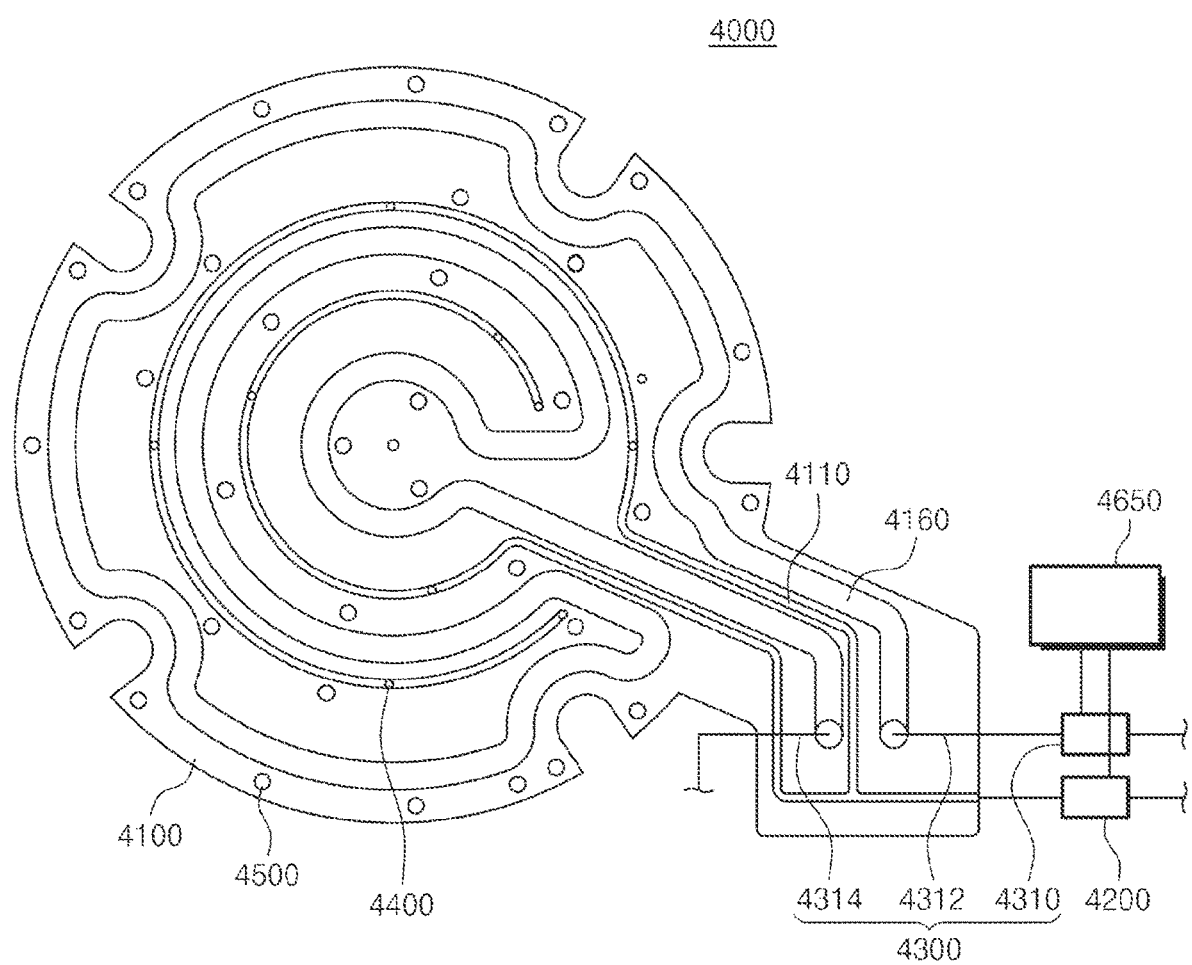
FIG. 10 is a plan view illustrating a supporting unit, according to an embodiment of the inventive concept.

FIG. 10 is a plan view illustrating a supporting unit according to an embodiment of the inventive concept. Referring to FIG. 10, the supporting unit 4000 may include a supporting plate 4100, a pressure reducing member 4200, a temperature adjusting member 4300, a flanger 4400, a pin 4500, and a controller 4650.

The supporting plate 4100 may have a substantially circular shape when viewed from above. The supporting plate 4100 may be formed in an outer circumferential part thereof with a notch. A plurality of notches may be formed.

The supporting plate 4100 may have a pressure reducing fluid passage 4110. The pressure reducing fluid passage 4110 may be formed inside the supporting plate 4100. The pressure reducing fluid passage 4110 may be formed between the central region and the edge region of the supporting plate 4100 when viewed from above. The pressure reducing fluid passage 4110 has one end connected to a pressure reducing member 4200 and an opposite end split into a plurality of parts, when viewed from above. The pressure reducing fluid passage 4110 split into the plurality of parts may be formed inside the supporting plate 4100 to form concentric circles around the center of the supporting plate 4100. In addition, the pressure reducing fluid passage 4110 split into the plurality of parts may communicate with each other.

The pressure reducing member 4200 may reduce the pressure in the pressure reducing fluid passage 4110. The pressure reducing member 4200 may be connected to the one end of the pressure reducing fluid passage 4110. The pressure reducing member 4200 may be a pump. However, the inventive concept is not limited thereto, but the pressure reducing member 4200 may be modified to well-known device to reduce pressure in the pressure reducing fluid passage 4110.

A heat transfer fluid passage 4160 may be formed in the supporting plate 4100. The heat transfer fluid passage 4160 may be formed between the central region, the intermediate region, and the edge region of the supporting plate 4100 when viewed from above. The heat transfer fluid passage 4160 may be connected to a temperature adjusting member 4300.

The temperature adjusting member 4300 may adjust the temperature of the supporting plate 4100. The temperature adjusting member 4300 may include a coolant supplying source 4310, a coolant supplying line 4312, and a discharging line 4314. The coolant supplying source 4310 may store a cooling fluid. The coolant supplying source 4310 may be connected to the coolant supplying line 4312. The coolant supplying source 4310 may supply the cooling fluid to the coolant supplying line 4312. The coolant supplying line 4312 may be connected to one end of the heat transfer fluid passage 4160. The discharging line 4314 may be connected to an opposite end of the heat transfer fluid passage 4160. In other words, when the coolant supplying source 4310 supplies the cooling fluid, the cooling fluid may be transferred to the heat transfer fluid passage 4160 through the coolant supplying line 4312 such that the cooling fluid flows through the heat transfer fluid passage 4160. Accordingly, the supporting plate 4100 may be cooled. The cooling fluid flowing through the heat transfer fluid passage 4160 may be discharged to the outside through the discharging line 4314.

In addition, the supporting plate 4100 may include a flanger 4400 and a pin 4500. The flanger 4400 and the pin 4500 may support the substrate 'W'. The flanger 4400 may move up and down by reduced pressure applied through the pressure reducing fluid passage 4110. The height of the pin 4500 may be fixed.

The controller 4650 may control the substrate processing apparatus 1. The controller 4650 may control the supporting unit 4650. The controller 4650 may control the pressure reducing member 4200 and the temperature adjusting member 4300. The controller 4650 may reduce pressure in the pressure reducing fluid passage 4110 by controlling the pressure reducing member 4200 or may stop reducing pressure. The controller 4650 may adjust the size of the pressure to be reduced in the pressure reducing fluid passage 4110. The controller 4650 may move the flanger 4400 in the vertical direction by controlling the pressure reducing member 4200. The controller 4650 may supply the cooling fluid to the heat transfer fluid passage 4160 or stop the supply of the cooling fluid by controlling the temperature adjusting member 4300. The controller 4650 may adjust an amount of cooling fluid supplied to the heat transfer fluid passage 4160 per unit time by adjusting the temperature adjusting member 4300. The controller 4650 may change the temperature of the supporting plate 4100 by controlling the temperature adjusting member 4300.

Figure 11:
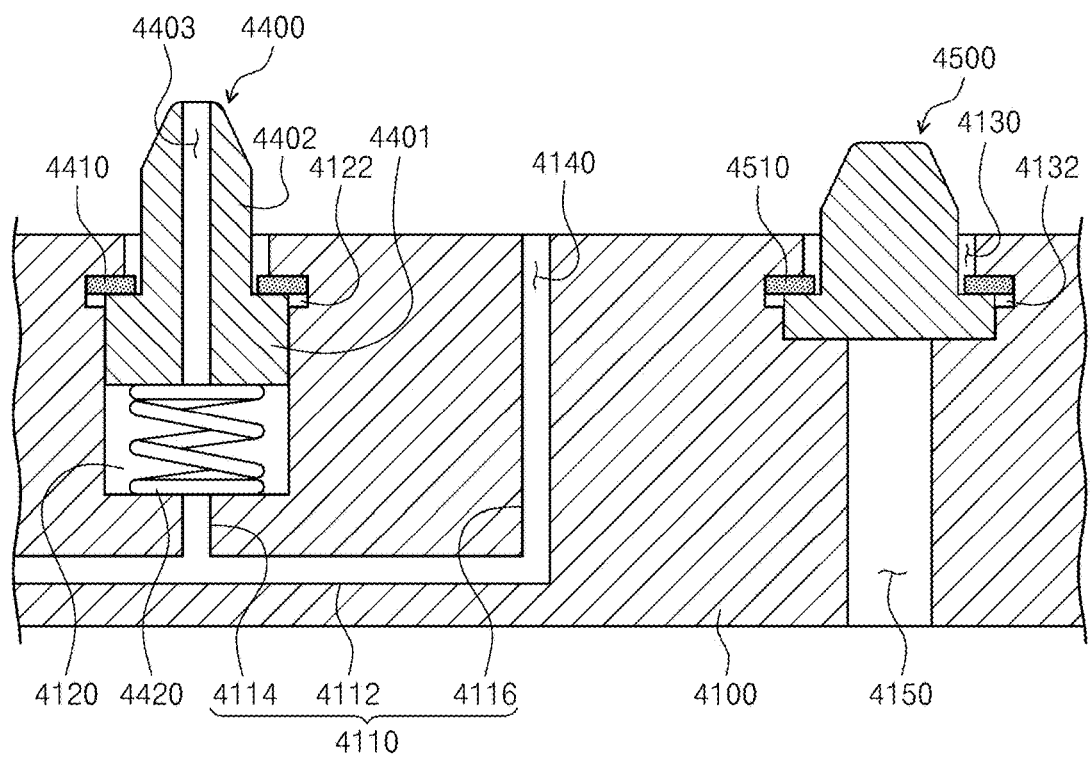
FIG. 11 is a sectional view illustrating a portion of the supporting unit of FIG. 10.

FIG. 11 is a sectional view illustrating a portion of a supporting unit of FIG. 10. Referring to FIG. 11, the pressure reducing fluid passage 4110 may be formed in the supporting plate 4100. The pressure reducing fluid passage 4110 may include a main fluid passage 4112, a first fluid passage 4114, and a second fluid passage 4116. The main fluid passage 4112 may be connected to the above-described pressure reducing member 4200. The first fluid passage 4114 may branch from the main fluid passage 4112. The second fluid passage 4116 may branch from the main fluid passage 4112. The second fluid passage 4116 may branch from the main fluid passage 4112 at a point different from a point from which the first fluid passage 4114 branches.

In addition, a groove may be formed in the supporting plate 4100. The supporting plate 4100 may have a first groove 4120 and a second groove 4130. The first groove 4120 and the second groove 4130 may be formed to be recessed downward from the top surface of the supporting plate 4100. The first groove 4120 is more deeply recessed than the second groove 4130. The first groove 4120 may have a first locking step 4122 that is stepped in a lateral direction of the first groove 4120. The second groove 4130 may have a second locking step 4132 that is stepped in the lateral direction of the second groove 4130.

In addition, the supporting plate 4100 may have a vacuum hole 4140 formed therein. The vacuum hole 4140 may be formed in the top surface of the supporting plate 4100. The vacuum hole 4140 may have a circular shape when viewed from above.

The first fluid passage 4114 of the above-described pressure reducing fluid passage 4110 may be connected to the first groove 4120. The second fluid passage 4116 of the pressure reducing fluid passage 4110 may extend to the top surface of the supporting plate 4100 to form the vacuum hole 4140.

The flanger 4400 may be provided in the first groove 4120. A portion of the flanger 4400 may be provided in the first groove 4120, and another portion of the flanger 4400 may be provided outside the first groove 4120. The flanger 4400 may have a through hole 4403. The through hole 4403 may pass through an upper portion and a lower portion of the flanger 4400. The through hole 4403 may communicate with the pressure reducing fluid passage 4110. The through hole 4403 may communicate with the first fluid passage 4114. A lower area of the flanger 4400 in the first groove 4120 may be connected to the pressure reducing fluid passage 4110. The lower area of the flanger 4400 may be connected to the first fluid passage 4114.

The flanger 4400 may include a first body 4401 and a second body 4402. The first body 4401 may have the shape of a cylinder having an upper portion and a lower portion which are open. The second body 4402 may have the shape of a cylinder having an upper portion and a lower portion which are open. The second body 4402 may have a diameter less than that of the first body 4401. The second body 4402 may extend upward from the top surface of the first body 4401. The upper end of the second body 4402 may have a rounded shape. Accordingly, when the substrate 'W' is seated, the bottom surface of the substrate 'W' may be prevented from being scratched.

The flanger 4400 may be formed of a material including synthetic resin or ceramic (AlO3). The synthetic resin may be a polyetheretherketone (Peek) resin. The synthetic resin may be a polybenzimidazole (PBI) resin.

A first locking member 4410 may be interposed between the top surface of the first body 4401 and the first locking step 4122. The first locking member 4410 may have a ring shape. The first locking member 4410 may have a ring shape having an open one side. The first locking member 4410 may be a C-ring. The first locking member 4410 may be interposed between the first locking step 4122 and the top surface of the first body 4401 to prevent the deviation of the flanger 4400 when the flanger 4400 moves up and down. When the replacement of the flanger 4400 is required as the flanger 4400 is continuously used, the first locking member 4410 is removed and the flanger 4400 may be separated from the first groove 4120.

An elastic member 4420 may be provided on the bottom surface of the first body 4401. The elastic member 4420 may be disposed in the first groove 4120. The elastic member 4420 may be a spring. The upper end of the elastic member 4420 may make contact with the bottom surface of the first body 4401. The lower end of the elastic member 4420 may make contact with the bottom surface of the first groove 4120. The elastic member 4420 may move the flanger 4400 in the vertical direction. For example, when pressure is reduced in the pressure reducing fluid passage 4110, the pressure is reduced in the first groove 4120 connected to the pressure reducing fluid passage 4110. In addition, the flanger 4400 may move down by the reduced pressure applied through the pressure reducing fluid passage 4110. In addition, when the reduction of pressure in the pressure reducing fluid passage 4110 is stopped, the reduction of the pressure may be stopped even in the first groove 4120 connected to the pressure reducing fluid passage 4110. In addition, the flanger 4400 may move up due to elastic force of the elastic member 4420.

The pin 4500 may be provided in the second groove 4130. A portion of the pin 4500 may be provided in the second groove 4130, and another portion of the pin 4500 may be provided to the outside of the second groove 4130. The pin 4500 may be a Proximiti pin. The distance between the top surface of the supporting plate 4100 and the upper end of the pin 4500 may be fixed. In other words, the height of the pin 4500 may be fixed. The pin 4500 may be fixed by the second locking member 4510 provided to the second locking step 4132 of the second groove 4130. The deviation of the pin 4500 may be prevented by the second locking member 4510 provided to the second locking step 4132

The second locking member 4510 may have a ring shape. The second locking member 4510 may have a ring shape having an open one side. The second locking member 4510 may be a C-ring. When the replacement of the pin 4500 is required as the pin 4500 is continuously used, the second locking member 4510 is removed and the pin 4500 may be separated from the second groove 4130. In addition, a separation hole 4150 may be formed in the supporting plate 4100 to easily remove the pin 4500 from the second groove 4130. The separation hole 4150 may extend to the second groove 4130 from the bottom surface of the supporting plate 4100.

Figure 12:
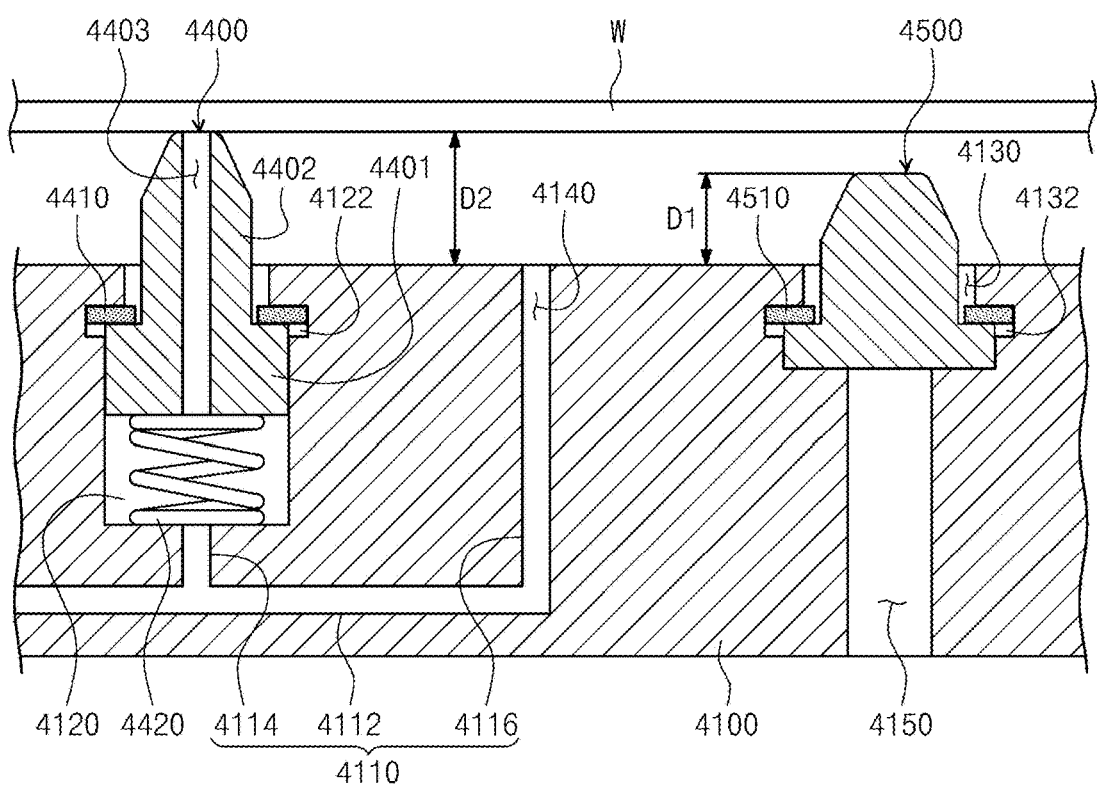
FIGS. 12 and 13 are sectional views illustrating movement of a flanger when a supporting unit is mounted on a substrate.
Figure 13:
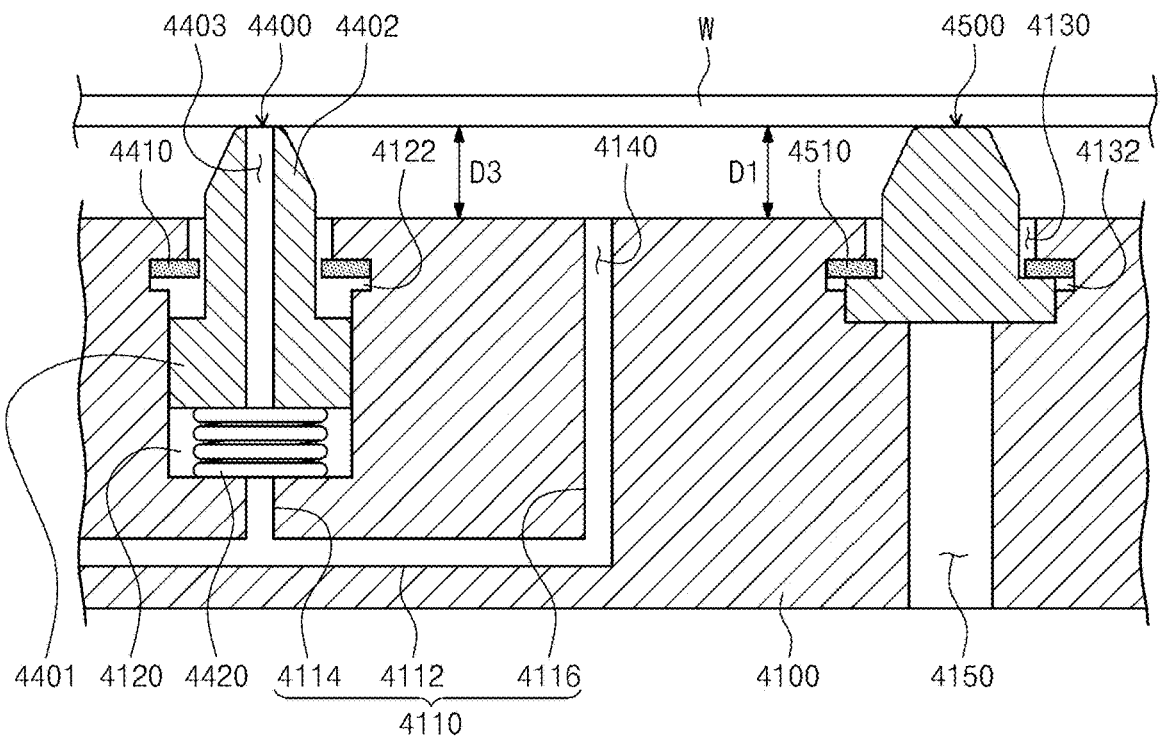

FIGS. 12 and 13 are views illustrating movement of a flanger when a substrate is seated on a supporting unit. Referring to FIG. 12, when the substrate 'W' is seated on the supporting unit 4000, the distance between the top surface of the supporting plate 4100 and the upper end of the pin 4500 may be provided with a first distance 'D1'. In addition, when the substrate 'W' is seated on the supporting unit 4000, the distance between the top surface of the supporting plate 4100 and the upper end of the flanger 4400 may be provided with a second distance 'D2'. In other words, when the pressure is not reduced in the pressure reducing fluid passage 4110, the distance between the top surface of the supporting plate 4100 and the upper end of the flanger 4400 may be provided with the second distance 'D2'. The second distance 'D2' may be greater than the first distance 'DP1'.

Referring to FIG. 13, when the temperature of the substrate 'W' supported by the supporting unit 4000 is adjusted, the pressure is reduced in the pressure reducing fluid passage 4110. The pressure reduced in the pressure reducing fluid passage 4110 is transferred to the first groove 4120. Accordingly, the flanger 4400 moves downward, so the distance between the supporting plate 4100 and the substrate 'W' is narrowed. When the flanger 4400 moves downward, the distance between the top surface of the supporting plate 4100 and the upper end of the flanger 4400 may be a third distance 'D3'. In other words, when the pressure is reduced in the pressure reducing fluid passage 4110, the distance between the top surface of the supporting plate 4100 and the upper end of the flanger 4400 may be provided with the third distance 'D3'. The second distance 'D3' may be less than the first distance D1'. The second distance 'D3' may be equal to the first distance D1'. In addition, when the temperature of the substrate 'W' is adjusted, the pressure reduced in the pressure reducing fluid passage 4110 is transferred even to the through hole 4403 of the flanger 4400. Accordingly, the substrate 'W' may be suctioned to the through hole 4403. In addition, the pressure reduced in the pressure reducing fluid passage 4110 is transferred even to the vacuum hole 4140. Accordingly, the substrate 'W' may be stably seated on the supporting unit 4000.

When the temperature of the substrate 'W' has been completely adjusted by heat transferred by the supporting plate 4100, the reduction of the pressure in the pressure reducing fluid passage 4110 may be stopped. Accordingly, the flanger 4400 may be changed similarly to the state illustrated in FIG. 12. In other words, when the reduction of the pressure in the pressure reducing fluid passage 4110 is stopped, the flanger 4400 may move upward by elastic force of the elastic member 4420. Accordingly, the substrate 'W' supported by the flanger 4400 may move upward.

When the substrate is cooled on the typical cooling plate, the pressure difference between the upper portion and the lower portion of the substrate is made. In addition, when the substrate is lifted from the cooling plate, the substrate receives force applied in the direction of the cooling plate, so the squeeze effect is caused. Accordingly, when the substrate is lifted, the substrate is bounced. Accordingly, the substrate is broken.

However, according to an embodiment of the inventive concept, when the temperature of the substrate 'W' has completely adjusted, the reduction of pressure in the pressure reducing fluid passage 4110 is stopped. Accordingly, the flanger 4400 moves upward. While the flanger 4400 moves upward, the substrate 'W' may be spaced apart from the supporting plate 4100. In this case, the force applied upward to the bottom surface of the substrate 'W' by the flanger 4400 is generated by the elastic force of the elastic member 4420. In other words, the flanger 4400 moves upward due to the pressure difference between the upper portion and the lower portion of the substrate 'W'. For example, when the pressure difference between the upper portion and the lower portion of the substrate 'W' is increased, the flanger 4400 may slowly move upward. Accordingly, the above-described squeeze effect may be removed.

In addition, according to an embodiment of the inventive concept, the distance between the substrate 'W' and the top surface of the supporting plate 4100 is the second distance 'D2' at the time point at which the substrate 'W' is seated on the supporting unit 4000. In addition, while the temperature of the substrate 'W' is adjusted, the distance between the substrate 'W' and the supporting plate is the first distance 'D1'. The first distance 'D1' is less than the second distance 'D2'. In other words, when the temperature of the substrate 'W' is adjusted, the distance between the substrate 'W' and the supporting plate 4100 may be minimized. Accordingly, the efficiency to process the substrate 'W' may be enhanced.

Figure 14:
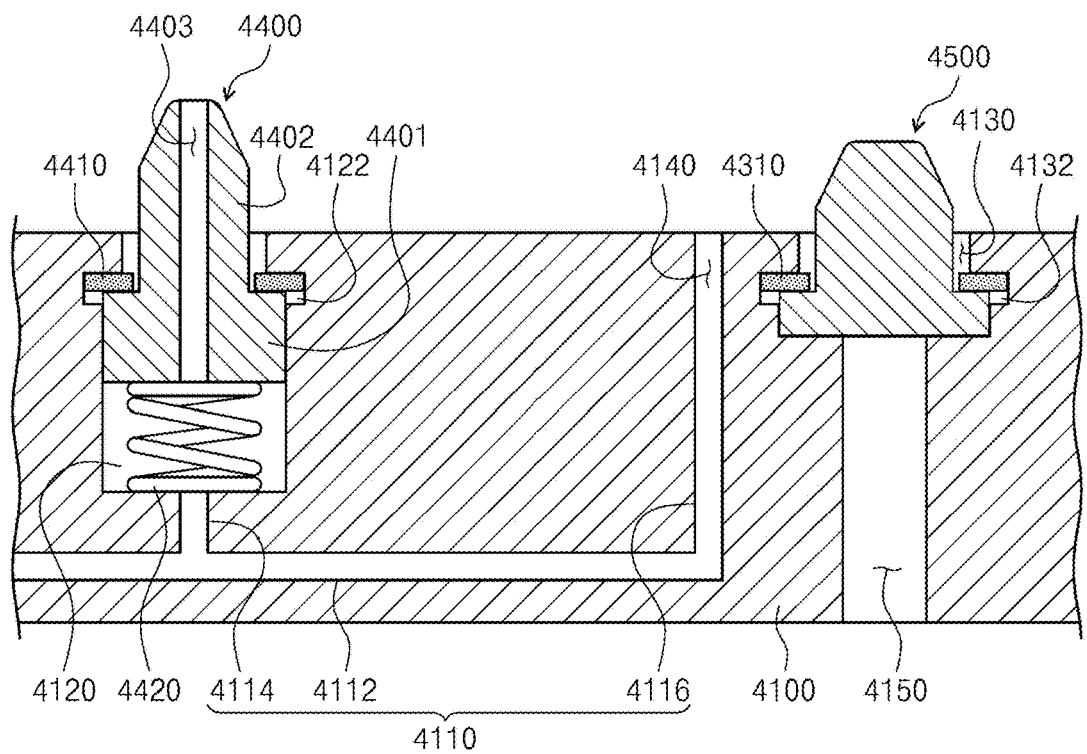
FIG. 14 is a sectional view illustrating a portion of a supporting unit, according to an embodiment of the inventive concept.

In addition, when the through hole 4403 is not formed in the flanger 4400, the second fluid passage 4116 and the vacuum hole 4140 should be formed in an area adjacent to the flanger 4440. Otherwise, the distance between a point in which pressure is reduced and a point in which the flanger 4400 is supported is increased. In this case, the substrate 'W' may be bent due to the pressure applied to the vacuum hole 4140. In addition, a load may be applied to the flanger 4400. However, according to an embodiment of the inventive concept, the through hole 4403 is formed in the flanger 4400. Accordingly, the flanger 4400 may suction the bottom surface of the substrate 'W'. In other words, since the flanger 440 may suction the substrate 'W', the position of the second fluid passage 4116 may be freely changed as illustrated in FIG. 14.

In addition, when the substrate 'W', which is bent, is seated on the supporting unit 4000, it may be difficult to appropriately seat the substrate 'W' only through the flanger 4400. The second fluid passage 4116 and the vacuum hole 4140 may reduce pressure applied to the bottom surface of the substrate 'W' such that the bent substrate 'W' is appropriately seated. In other words, the second fluid passage 4116 and the vacuum hole 4140 may complement the suction of the substrate 'W' by the flanger 4400.

Referring back to FIGS. 2 to 4, the developing block 30b has the heat treating chamber 3200, the carrying chamber 3400, and the liquid treating chamber 3600. The heat treating chamber 3200, the carrying chamber 3400, and the liquid treating chamber 3600 in the developing block 30b have the structures and the arrangement substantially similar to those of the heat treating chamber 3200, the carrying chamber 3400, and the liquid treating chamber 3600 in the coating block 30a, so the details thereof will be omitted. However, all the liquid treating chambers 3600 in the developing block 30b supply the same developing liquid such that the substrate 'W' is subject to the developing treatment.

The interface module 40 connects the treating module 30 with an external exposing device 50. The interface module 40 has an interface frame 4100, an additional process chamber 4200, an interface buffer 4400, and a carrying member 4600.

A fan filter unit may be provided on the upper end of the interface frame 4100 to form a descending air stream in the interface frame 4100. The additional process chamber 4200, the interface buffer 4400, and the carrying member 4600 are provided inside the interface frame 4100. The substrate 'W' subject the process in the coating block 30a may be subject to a predetermined additional process in the additional process chamber 4200 before introduced into the exposing device 50. Alternatively, the substrate 'W' subject the process in the exposing device 50 may be subject to a predetermined additional process in the additional process chamber 4200 before introduced into the developing block 30b. According to an embodiment, the additional process may be an edge exposing process to expose an edge area of the substrate 'W', a top surface cleaning process to clean the top surface of the substrate 'W', or a bottom surface cleaning process to clean the bottom surface of the substrate 'W'. A plurality of additional process chambers 4200 may be provided and may be provided to be stacked on each other. All the additional process chambers 4200 may be provided to perform the same process. Alternatively, some of the additional process chambers 4200 may be provided to perform mutually different processes.

The interface buffer 4400 provides a space to temporarily stay the substrate 'W', which is carried among the interface buffer 4400, the coating block 30a, the additional process chamber 4200, the exposing device 50, and the developing block 30b. A plurality of interface buffers 4400 are provided and may be provided to be stacked on each other.

According to an embodiment, when viewed based on a line extending in the lengthwise direction of the carrying chamber 3400, the additional process chamber 4200 may be disposed at one side, and the interface buffer 4400 may be disposed at an opposite side.

The carrying member 4600 carries the substrate 'W' between the coating block 30a, the additional process chamber 4200, the exposure device 50, and the developing block 30b. The carrying member 4600 may be provided with one or a plurality of robots. According to an embodiment, the carrying member 4600 has a first robot 4602 and a second robot 4606. The first robot 4602 may be provided to carry the substrate 'W' among the coating block 30a, the additional process chamber 4200, and the interface buffer 4400, and the interface robot 4606 may be provided to carry the substrate 'W' between the interface buffer 4400 and the exposing device 50, and the second robot 4604 may be provided to carry the substrate 'W' between the interface buffer 4400 and the developing block 30b.

The first robot 4602 and the second robot 4606 may include hands in which the substrate 'W' is placed, and the hands may be provided to be movable forward and backward, rotatable about the Z-axis direction 16, and movable in the Z-axis direction 16.

Figure 15:
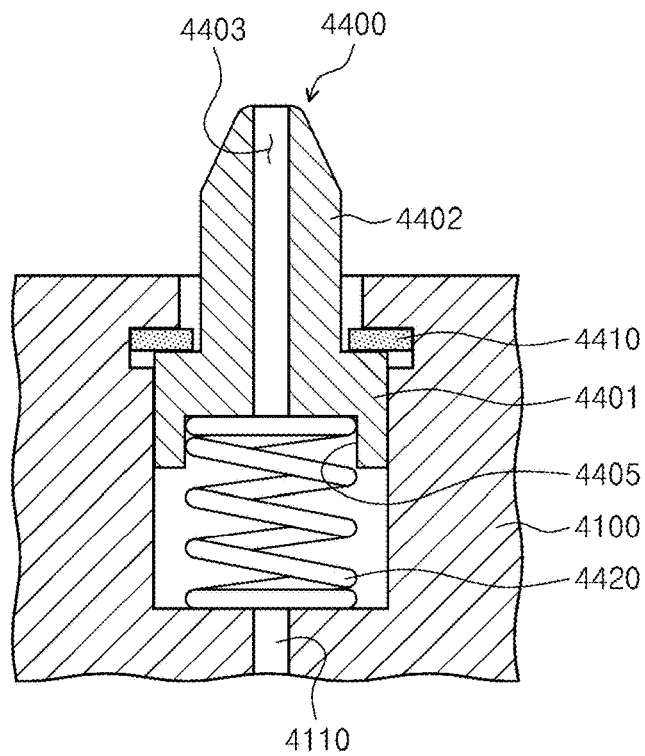
FIG. 15 is a sectional view illustrating a portion of a supporting unit, according to another embodiment of the inventive concept.

Although the above-described embodiment has been described in that the elastic member 4420 is provided on the bottom surface of the first body 4401, the inventive concept is not limited thereto. For example, as illustrated in FIG. 15, an insertion end portion 4405 may be formed in the first body 4401. The insertion end portion 4405 may be recessed upward from the bottom surface of the first body 4401. The insertion end portion 4405 may communicate with the through hole 4403. An upper portion of the elastic member 4420 may be inserted into the insertion end portion 4405. According to another embodiment of the inventive concept, since the elastic member 4420 is inserted into the insertion end portion 4405, the elastic member 4420 may be prevented from being shaken or deviating from the position thereof.

Figure 16:
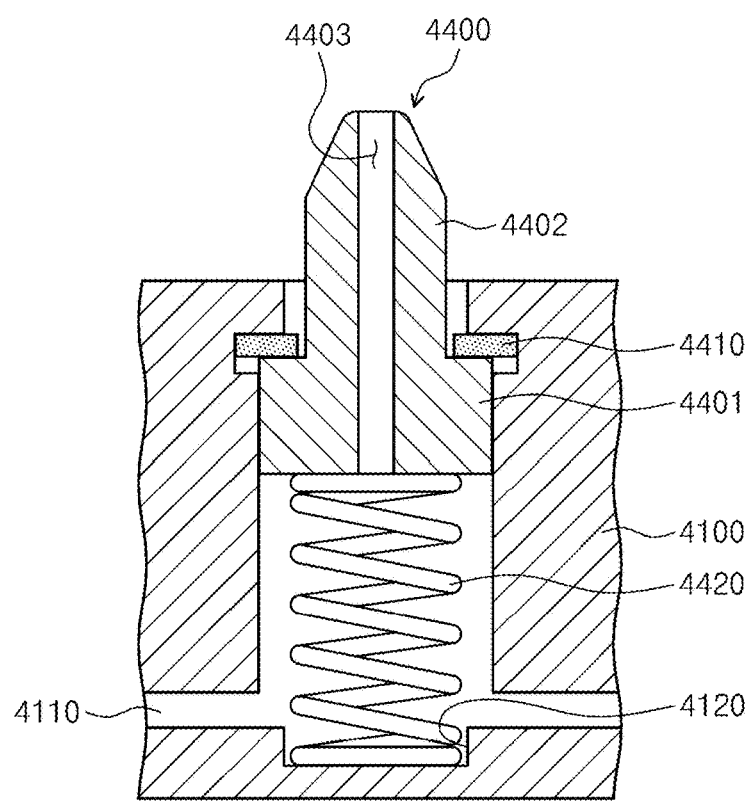
FIG. 16 is a sectional view illustrating a portion of a supporting unit, according to an embodiment of the inventive concept.

Although the above-described embodiment has been described in that the elastic member 4420 is provided in the first groove 4120, the inventive concept is not limited thereto. For example, as illustrated in FIG. 16, the first groove 4120 may pass through the pressure reducing fluid passage 4110, and may be recessed downward from the pressure reducing fluid passage 4110. In addition, the lower end of the elastic member 4420 may be provided in the first groove 4120 which is positioned lower than the pressure reducing fluid passage 4110. An intermediate end of the elastic member 4420 may be provided in the pressure reducing fluid passage 4110. In addition, the upper end of the elastic member 4420 may be provided in the first groove 4120 which is positioned higher than the pressure reducing fluid passage 4110.

As described above, according to an embodiment of the inventive concept, the substrate may be efficiently processed.

In addition, according to an embodiment of the inventive concept, the distance between the substrate and the supporting plate may be reduced when the substrate is heat-processed.

Further, according to an embodiment of the inventive concept, the squeeze effect caused when the substrate is heat processed may be minimized.

The effects of the inventive concept are not limited to the above-described effects, and those skilled in the art can apparently understand effects other than the above effects, from the present specification and accompanying drawings.

The above description has been made for the illustrative purpose. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. The written embodiment describes the best state for implementing the technical spirit of the inventive concept, and various changes required in the detailed application fields and purposes of the inventive concept can be made. Furthermore, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for processing a substrate, the apparatus comprising:
   a housing having a space inside the housing; and
   a supporting unit configured to support the substrate, in the space,
   wherein the supporting unit includes,
   a supporting plate having a pressure reducing fluid passage inside the supporting plate,
   a temperature adjusting member configured to adjust a temperature of the supporting plate,
   a flanger in a groove, the groove in a top surface of the supporting plate, and a pin on the supporting plate,
   wherein in the groove a lower area of the flanger is connected to the pressure reducing fluid passage,
   the flanger is configured to move up or down by a change in pressure applied through the pressure reducing fluid passage, and
   the pressure reducing fluid passage includes a channel extending through the support plate, the channel in fluid communication with the groove and with a vacuum hole on an upper surface of the supporting plate,
   wherein a distance between a top surface of the supporting plate and an upper end of the pin is provided as a first distance,
   wherein, in the flanger, the distance between the top surface of the supporting plate and an upper end of the flanger is a second distance, in response to the reduced pressure not being applied through the pressure reducing fluid passage,
   the distance between the top surface of the supporting plate and the upper end of flanger is a third distance, in response to the reduced pressure being applied through the pressure reducing fluid passage,
   the second distance is greater than the first distance, and
   the third distance is less than or equal to the first distance.

2. The apparatus of claim 1, wherein the flanger has a through hole passing through an upper portion of the flanger and through a lower portion of the flanger, and
   wherein the through hole is in fluid communication with the pressure reducing fluid passage.

3. The apparatus of claim 2, wherein the flanger includes:
   a first body; and
   a second body extending upward from the first body and having a diameter less than a diameter of the first body.

4. The apparatus of claim 3, wherein the groove has a locking step which is stepped in a lateral direction of the groove, and
   a locking member is between a top surface of the first body and the locking step.

5. The apparatus of claim 3, further comprising:
   an elastic member on a bottom surface of the first body.

6. The apparatus of claim 3, wherein the first body defines an insertion end portion recessed upward from a bottom surface of the first body,
   the insertion end portion is in fluid communication with the through hole, and
   an elastic member is configured to be inserted into the insertion end portion.

7. The apparatus of claim 3, wherein an upper end of the second body has a rounded shape.

8. The apparatus of claim 1, wherein the apparatus further includes:

a controller configured to control the supporting unit,
wherein the controller is configured to,
control the supporting unit to reduce a distance between the supporting plate and the substrate by moving the Hanger down as the reduced pressure is applied through the pressure reducing fluid passage, the reducing the distance being in response to adjusting a temperature of the substrate supported to the supporting unit.

9. The apparatus of claim 1, wherein the pressure reducing fluid passage includes:
a main fluid passage;
a first fluid passage branching from the main fluid passage; and
a second fluid passage branching from the main fluid passage at a point, which is different from a point from which the first fluid passage branches,
wherein the first fluid passage is connected to the groove, and
the second fluid passage extends to the top surface of the supporting plate.

10. The apparatus of claim 1, wherein the supporting plate defines a heat transfer fluid passage through which a fluid supplied by the temperature adjusting member flows.

11. A supporting unit to support a substrate, the supporting unit comprising:
a supporting plate defining a pressure reducing fluid passage inside the supporting plate;
a flanger in a groove, the groove in a top surface of the supporting plate; and
a pin on the supporting plate,
wherein a lower area of the flanger is connected to the pressure reducing fluid passage in the groove, and
the flanger is configured to move up and down based on the pressure applied through the pressure reducing fluid passage,
the pressure reducing fluid passage includes a channel extending through the support plate, the channel in fluid communication with the groove and with a vacuum hole on an upper surface of the supporting plate,
wherein a distance between a top surface of the supporting plate and an upper end of the pin is provided as a first distance,
wherein, in the flanger, the distance between the top surface of the supporting plate and an upper end of the flanger is a second distance, in response to the reduced pressure not being applied through the pressure reducing fluid passage,
the distance between the top surface of the supporting plate and the upper end of flanger is a third distance, in response to the reduced pressure being applied through the pressure reducing fluid passage,
the second distance is greater than the first distance, and
the third distance is less than or equal to the first distance.

12. The supporting unit of claim 11, wherein the flanger has a through hole passing through an upper portion and a lower portion of the flanger, and
the through hole is in fluid communication with the pressure reducing fluid passage.

13. The supporting unit of claim 12, wherein the flanger includes:
a first body; and
a second body extending upward from a top surface of the first body and having a diameter less than a diameter of the first body.

14. The supporting unit of claim 13, wherein the groove has a locking step which is stepped in a lateral direction of the groove, and
a locking member is interposed between a top surface of the first body and the locking step.

15. The supporting unit of claim 13, further comprising:
an elastic member on a bottom surface of the first body.

16. The supporting unit of claim 15, wherein the elastic member is a spring.

17. The supporting unit of claim 13, wherein the first body includes an insertion end portion recessed upward from a bottom surface of the first body,
the insertion end portion communicates with the through hole, and
an elastic member is inserted into the insertion end portion.

18. The supporting unit of claim 13, wherein an upper end of the second body has a rounded shape.

* * * * *